United States Patent [19]

Mar

[11] 4,207,615
[45] Jun. 10, 1980

[54] NON-VOLATILE RAM CELL

[75] Inventor: Jerry Mar, Sunnyvale, Calif.

[73] Assignee: Intel Corporation, Santa Clara, Calif.

[21] Appl. No.: 961,753

[22] Filed: Nov. 17, 1978

[51] Int. Cl.$^2$ ............................................. G11C 11/40
[52] U.S. Cl. .................................... 365/95; 365/154; 365/185; 365/228
[58] Field of Search ................. 365/95, 154, 184, 185, 365/228; 307/DIG. 4, 238, 279

[56] References Cited

U.S. PATENT DOCUMENTS

| | | | |
|---|---|---|---|
| 3,953,839 | 4/1976 | Dennison et al. | 365/154 |
| 3,969,708 | 7/1976 | Sonoda | 365/154 |
| 4,095,281 | 6/1978 | Denes | 365/184 |
| 4,122,541 | 10/1978 | Uchida | 365/184 |
| 4,128,773 | 12/1978 | Troutman et al. | 365/185 |
| 4,132,904 | 1/1979 | Harari | 365/185 |

Primary Examiner—Stuart N. Hecker
Attorney, Agent, or Firm—Blakely, Sokoloff, Taylor & Zafman

[57] ABSTRACT

A non-volatile MOS memory cell which includes a bistable (flip-flop) circuit with slightly imbalanced loads. An electrically programmable, floating gate device is coupled across a portion of one of the loads to permit selective shunting. When the cell is powered-down (such as at power failure), the floating gate is either charged or discharged as a function of the state of the flip-flop. When power is reapplied, the imbalance caused by the selective shunting forces the flip-flop to its previous state. The relatively small cell does not require resetting, and the stored information is returned in its true (non-complementary) form when the cell is reactivated.

1 Claim, 2 Drawing Figures

NON-VOLATILE RAM CELL

BACKGROUND OF THE INVENTION

1. Field of the Invention

The invention relates to the field of non-volatile MOS memory cells.

2. Prior Art

In some applications, it is necessary to retain the information stored in random-access memories (RAMs) when power is interrupted or fails. Most often the power supplies for these memories have a considerable amount of capacitance, and thus store sufficient energy to operate the memory for a second or more after the interruption of power. The interruption of power, however, is immediately sensed and measures taken to retain the information in the RAMs in some form which will not be lost when the energy in the power supplies dissipates.

Numerous prior art RAM cells are known which retain information when deactivated. One category of these devices employs a silicon nitride layer (NMOS devices) to selectively store charge when the cell is powered down. These cells are relatively large in area and require resetting after each power-down/retention cycle.

Floating gate memory devices are employed in conjunction with bistable circuits to form a non-volatile RAM cell. These memory devices are typically used as memory cells in read-only memories. The closest prior art known to Applicant was disclosed at the IEEE International Solid-State Circuit Conference, Feb. 16, 1978, Session IX: *Static and Nonvolatile Memories*, in a paper entitled "A 256-Bit Nonvolatile Static RAM" by Harari, et al. In this non-volatile RAM cell, floating gate memory devices are employed as the control transistors in a bistable (flip-flop) circuit. This cell has a number of disadvantages, including the fact that the charging and discharging of the floating gate must be carefully controlled if proper operation of the cell is to be obtained. Moreover, during a power-down/retention cycle, the complement of the data is obtained, not the true data.

SUMMARY OF THE INVENTION

A metal-oxide-semiconductor (MOS) non-volatile memory cell is disclosed. First and second loads are coupled in series with first and second transistors respectively, with the gates of the transistors cross-coupled to form a bistable circuit. An electrically alterable memory device which includes a floating gate and a control gate is coupled across a portion of the second load. This device permits selective shunting of this portion of the second load. By the application of a programming potential to the cell when the cell is powered down, the floating gate is selectively programmed as a function of the state of the bistable circuit. When the cell is reactivated, the selective shunting (or the lack of the shunting) forces the bistable circuit to assume the state which existed when powered down. The slight imbalance in loads has substantially no effect on the normal operation of the cell.

DETAILED DESCRIPTION OF THE INVENTION

A metal-oxide-semiconductor (MOS) non-volatile, random-access memory (RAM) cell is described. In the following description, numerous specific details, such as conductivity types, are set forth to provide a thorough understanding of the invented cell. However, it will be obvious to one skilled in the art that these specific details are not required to employ the invented cell. In other instances, well-known semiconductor processing steps and circuit design techniques are not set forth in detail in order not to obscure the present invention in unnecessary detail.

Figure 1:
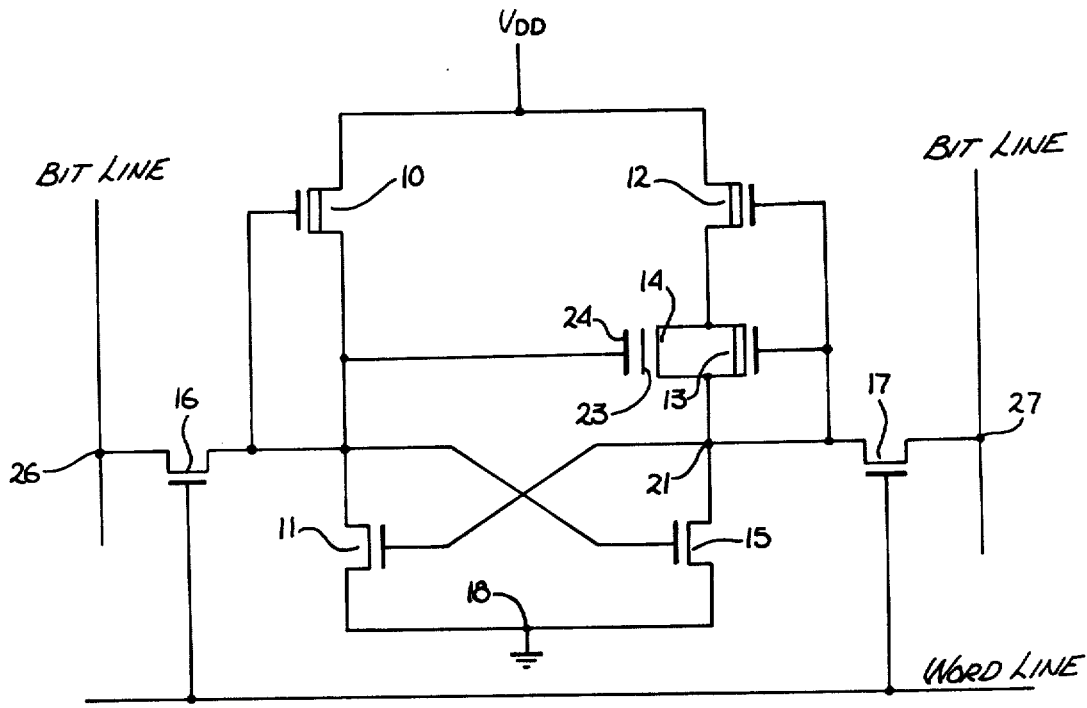
FIG. 1 is an electrical schematic of the presently preferred embodiment of the invented non-volatile memory cell.

The RAM cell of the present invention, as shown in FIG. 1, includes a first branch comprising transistors 10 and 11, and a second branch comprising transistors 12, 13 and 15. The gates of transistors 11 and 15 are cross-coupled so as to form a bistable circuit. The depletion mode transistor 10, which acts as a load, has one of its terminals coupled to the potential $V_{DD}$ and the other of its terminals and gate coupled to node 20. The enhancement mode transistor 11 is coupled between node 20 and the ground node 18. The second load for the bistable circuit, which comprises the series-connected depletion mode transistors 12 and 13, is coupled between $V_{DD}$ and node 21. The enhancement mode transistor 15 is coupled between node 21 and the ground node 18. The transistors 12 and 13 have their gates coupled to node 21, such that these transistors act as a depletion load. The gate of the transistor 11 is cross-coupled to node 21, and likewise the gate of the transistor 15 is cross-coupled to node 20.

In a typical integrated circuit memory, the cell of FIG. 1 is coupled to bit lines. For example, node 20 is coupled through the transistor 16 to a contact 26 on one bit line, and node 21 is coupled through transistor 17 to a contact 27 on another bit line. The gates of the transistors 16 and 17 are coupled to a word line which is activated when the cell of FIG. 1 is accessed.

The resistance provided by the depletion mode transistors 12 and 13 is slightly more than the resistance provided by the transistor 10. In the presently preferred embodiment, the transistors 12 and 13 provide approximately 10 percent more impedance than the transistor 10.

A floating gate device 14 has its terminals coupled across the transistor 13 and its control gate 24 coupled to node 20. By selectively charging or discharging the floating gate 23 of device 14, the transistor 13 is shunted. When the transistor 13 is shunted, the resistance provided by the transistor 12 is approximately 10 percent less than the resistance provided by the transistor 10.

In the presently preferred embodiment, the field-effect transistors of FIG. 1 are n-channel devices employing polycrystalline silicon gates. These transistors may be fabricated with one of many well-known MOS integrated circuit, photolithographic process. The process employed to fabricate the floating gate device 14 uses two layers of polysilicon, the first layer employed to define the floating gate 23 and the second layer the gate 24. This second layer is also used to form all the gates of the transistors of FIG. 1.

While numerous electrically programmable floating gate devices are known, the floating gate device preferred in the present invention employs a thin oxide, permitting charge to be tunneled into and from the floating gate. This technology and numerous specific cells are described in copending application Ser. No. 881,029 filed Feb. 24, 1978 now abandoned, entitled "ELECTRICALLY PROGRAMMABLE AND ERASABLE MOS FLOATING GATE MEMORY DEVICE EMPLOYING TUNNELING", and is assigned to the assignee of the present application. It is presently preferred that the floating gate device used in the invented cell employ a thin oxide over the entire channel region, particularly for the layout set forth in FIG. 2. However, other layouts and other floating gate memory devices may be employed, as will be obvious to one skilled in the art.

In the presently preferred embodiment, the memory device 14 of FIG. 1 has a threshold voltage of greater than 4 volts when its floating gate 23 is negatively charged. During typical n-channel (5-volt) operation, the potential on the control gate 24 of this device does not reach its threshold voltage and the device 14 remains non-conductive or off. For this condition, transistor 13 is not shunted. When the floating gate 24 is not charged (or slightly positively charged), the threshold voltage of device 14 is less than zero; thus, the transistor 13 is continually shunted independent of the potential applied to the control gate 24.

As previously mentioned, the load associated with transistors 12 and 13 is either approximately 10 percent greater or less than the other load (transistor 10), depending upon the charge state of the floating gate 23. This imbalance of approximately 10 percent does not affect the normal operation of the cell and thus the cell operates as an ordinary bistable circuit in the RAM. Note that during normal operation the charge state of the floating gate 23 does not influence the operation of the cell.

Assume for sake of discussion that node 21 is high when power is interrupted; that is, transistor 11 is conducting and transistor 15 is off. When the power interruption is sensed, a programming potential is applied to the cell. As previously mentioned, there is sufficient time to sense the power interruption and take steps to retain the information in the cells before the energy is drained from the power supply. In the presently preferred embodiment, $V_{DD}$ is normally 5 volts. However, when a power-interrupt is sensed, this potential is raised to 25 volts for approximately 10 milliseconds. Since it was assumed that node 21 is high, this node rises to approximately 20 volts and the control gate 24 of device 14 remains at approximately ground potential. Thus, the source and drain of device 14 are at approximately 20 volts and its control gate at zero volts. For these conditions, any negative charge on the floating gate 23 is tunneled through the thin oxide separating the floating gate from the channel region. As mentioned for this charge state, the threshold voltage of device 14 is less than zero volts. Thus when the cell is reactivated, transistor 13 is shunted. Since the resistance associated with transistor 10 is greater than that of transistor 12, node 21 rises more quickly, thereby causing transistor 11 to conduct. This returns the cell to the state it was in when the power was interrupted.

Assume now that node 20 is high when the power-interrupt is detected. When the programming potential of 25 volts is applied, the gate 24 is brought to a potential of approximately 20 volts; however, the source and drain terminals of device 14 are at a much lower potential. For these conditions, negative charge is transferred from the substrate into the floating gate 23. This brings the threshold voltage of device 24 above 4 volts. When power is next applied, the resistance associated with the transistor 13 is not shunted and thus the load comprising transistors 12 and 13 is greater than the load of transistor 10. This causes node 20 to rise in potential more quickly, turning on transistor 15 and cutting off transistor 11. This returns the bistable circuit to the state which existed when the power was interrupted.

In the presently preferred embodiment, approximately 5 mil$^2$ of substrate area is required to fabricate the cell of FIG. 1. Each of the transistors is somewhat larger in area than would otherwise be required in order to accommodate the higher programming potential.

Figure 2:
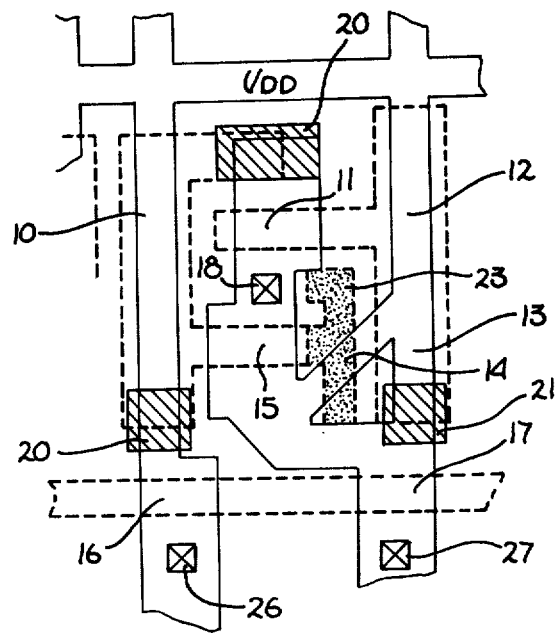
FIG. 2 is a plan view of the presently preferred layout for the cell of FIG. 1.

In the preferred layout of the cell, shown in FIG. 2, the polysilicon substrate contacts are shown as the cross-hatched areas. The second layer of polysilicon which is employed to form all the gates except for the floating gate 23 is shown by the dotted line. The solid line of FIG. 2 represents the diffusion mask which is used to define the arsenic source/drain regions. Finally, the dotted area represents the floating gate 23, which gate is formed from a first layer of polysilicon. In FIG. 2, the active channel regions are numbered for each transistor with the corresponding number employed in FIG. 1.

In FIG. 2, two buried contacts are required to define the node 20. One of these buried contacts connects the gates of transistors 10 and 15 with the drain of transistor 16 and the other providing a connection to the drain of transistor 11. The contact at node 21 connects the gates of transistors 12 and 13 and the gate of transistor 11 to the drain of transistors 15 and 17. Metal contacts at node 26 and 27 are required to provide coupling to the metal bit lines. Another metal contact at node 18 provides coupling to the ground line.

Thus, a non-volatile static RAM cell has been described which employs a floating gate memory device to selectively shunt a portion of one load. During a power-down/retention cycle, the cell, when reactivated, is returned to the same state that existed at power-down. The state of charge on the floating gate does not affect the normal operation of the cell. For this reason, no resetting is required after each power-down/retention cycle.

I claim:

1. An MOS memory cell comprising:
   a first depletion mode transistor;
   a first enhancement mode transistor coupled in series with said first depletion mode transistor;
   a second and a third depletion mode transistors coupled in series;
   a second enhancement mode transistor coupled in series with said second and third depletion mode transistors;
   the gates of said first and second enhancement mode transistors being cross-coupled so as to form a bistable circuit with said first, second and third depletion mode transistors;
   an electrically programmable memory device having a floating gate and a control gate, said control gate being coupled to one of said gates of said enhancement mode transistors, the terminals of said device being coupled across said third depletion mode transistor so as to permit selective shunting of said third depletion mode transistor;
   whereby said floating gate of said device is charged or discharged as a function of the state of said bistable circuit when said cell is powered down.

* * * * *